(12) United States Patent
Buller et al.

(10) Patent No.: US 6,821,853 B1
(45) Date of Patent: Nov. 23, 2004

(54) DIFFERENTIAL IMPLANT OXIDE PROCESS

(75) Inventors: James F. Buller, Austin, TX (US); Scott Luning, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/159,413

(22) Filed: May 31, 2002

(51) Int. Cl.[7] .......................................... H01L 21/8234
(52) U.S. Cl. ..................... 438/275; 438/176; 438/265; 438/179
(58) Field of Search ................................. 438/176, 265, 438/275, 179, 762, 763, 153, 154, 201, 230, 258, 303, 231, 286, 305

(56) References Cited

U.S. PATENT DOCUMENTS

| | | | |
|---|---|---|---|
| 4,757,026 A | * | 7/1988 | Woo et al. ................... 438/231 |
| 5,371,026 A | * | 12/1994 | Hayden et al. ............. 438/275 |
| 6,399,448 B1 | | 6/2002 | Mukhopadhyay et al. .. 438/275 |
| 6,403,425 B1 | | 6/2002 | Ang et al. ................... 438/283 |

* cited by examiner

Primary Examiner—George Fourson
Assistant Examiner—Julio J. Maldonado
(74) Attorney, Agent, or Firm—Timothy M. Honeycut

(57) ABSTRACT

Methods of manufacturing are provided. In one aspect, a method of manufacturing is provided that includes forming first and second gate stacks on a substrate and forming an insulating layer on the substrate. The insulating layer has portions adjacent to the first stack and portions adjacent to the second gate stack. A first pair of insulating structures is formed adjacent to the first gate stack and a second pair of insulating structures is formed adjacent to the second gate stack. The first pair of insulating structures is removed. The portions of the insulating layer adjacent to the first gate stack are thickened while the second pair of insulating structures prevents thickening of the portions of the insulating film adjacent to the second gate stack. Differential insulating layer thickness for different gate devices is permitted to enable reduction in leakage currents for selected devices without harming speed performance for others.

21 Claims, 2 Drawing Sheets

DIFFERENTIAL IMPLANT OXIDE PROCESS

BACKGROUND OF THE INVENTION

1. Field of the Invention

This invention relates generally to semiconductor processing, and more particularly to a method of fabricating an insulating film with different thicknesses for given transistor devices.

2. Description of the Related Art

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain, one implant to establish lightly doped drain structures and the other to establish overlapping heavier doped regions. The substrate is then annealed to activate the dopant in the source and the drain. Salicidation steps frequently follow the formation of the source and drain.

The gate dielectric formation aspects of conventional transistor fabrication present certain disadvantages. Silicon dioxide gate oxide layers are made as thin as possible to maximize drive current and to control short channel effects. The requirement for very thin gate oxide layers has become particularly important in sub-micron processing where process scaling has dramatically increased the potential for short channel effects. However, the scaling of silicon dioxide gate dielectric layers has introduced another set of problems. As the thickness of silicon dioxide is scaled downward, the potential for reliability problems associated with dielectric breakdown and hot-carrier-injection degradation increases. Hot carrier degradation can significantly reduce device performance, while dielectric breakdown can lead to complete device failure. Gate current from drain to gate is another drawback. The phenomenon is particularly prevalent at the lower corners of a gate electrode where the electric field density is highest. This gate current can contribute to circuit static leakage current and result in excessive power and heat generation.

Increasing the amount of the insulating material or utilizing high-k dielectrics between the gate corners and source/drain regions can reduce leakage currents. However, such techniques can reduce the switching speed of the transistor or present process integration challenges.

The present invention is directed to overcoming or reducing the effects of one or more of the foregoing disadvantages.

SUMMARY OF THE INVENTION

In accordance with one aspect of the present invention, a method of manufacturing is provided that includes forming first and second gate stacks on a substrate and forming an insulating layer on the substrate. The insulating layer has portions adjacent to the first gate stack and portions adjacent to the second gate stack. A first pair of insulating structures is formed adjacent to the first gate stack and a second pair of insulating structures is formed adjacent to the second gate stack. The first pair of insulating structures is removed. The portions of the insulating layer adjacent to the first gate stack are thickened while the second pair of insulating structures prevents thickening of the portions of the insulating layer adjacent to the second gate stack.

In accordance with another aspect of the present invention, a method of manufacturing is provided that includes forming a speed path critical gate stack and a non-speed path critical gate stack on a substrate. An insulating layer is formed on the substrate. The insulating layer has portions adjacent to the speed path critical gate stack and portions adjacent to the non-speed path critical gate stack. A first pair of insulating structures is formed adjacent to the speed path critical gate stack and a second pair of insulating structures is formed adjacent to the non-speed path critical gate stack. The second pair of insulating structures is removed. The portions of the insulating layer adjacent to the non-speed path critical gate stack are thickened while the second pair of insulating structures prevents thickening of the portions of the insulating layer adjacent to the speed path critical gate stack.

In accordance with another aspect of the present invention, a method of manufacturing is provided that includes forming a speed path critical gate stack and a non-speed path critical gate stack on a substrate. An oxide layer is formed on the substrate by oxidation. The oxide layer has portions adjacent to the speed path critical gate stack and portions adjacent to the non-speed path critical gate stack. A first pair of silicon nitride structures is formed adjacent to the speed path critical gate stack and a second pair of silicon nitride structures is formed adjacent to the non-speed path critical gate stack. The second pair of silicon nitride structures is removed. The portions of the oxide layer adjacent to the non-speed path critical gate stack are thickened while the second pair of silicon nitride structures prevents thickening of the portions of the oxide layer adjacent to the speed path critical gate stack.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
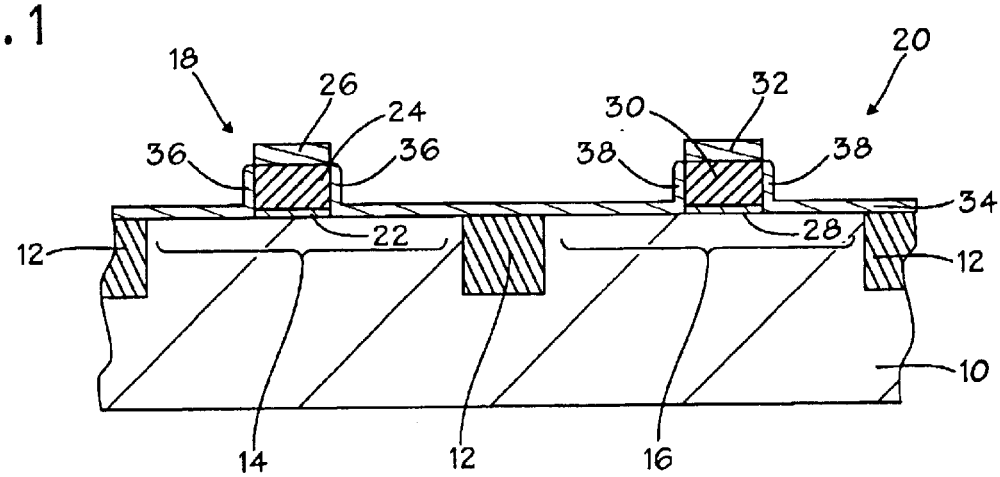
FIG. 1 is a cross-sectional view of an exemplary substrate upon which two gate stacks and an insulating layer are formed in accordance with an exemplary embodiment of the present invention.

In the drawings described below, reference numerals are generally repeated where identical elements appear in more than one figure. Turning now to the drawings, FIGS. 1–6 depicts successive cross-sectional views of an exemplary semiconductor substrate 10 undergoing processing in accordance with an exemplary embodiment of the present invention. Turning initially to FIG. 1, therein is shown the semiconductor substrate 10 initially provided with one or more isolation structures 12 that establish lateral electrical isolation for device regions 14 and 16. The substrate 10 may be composed of p-doped silicon, n-doped silicon, silicon-on-insulator or other suitable substrate materials. The isolation structure(s) 12 may be shallow trench isolation, field oxide, or other isolation structures. In an exemplary embodiment, the structure(s) 12 are shallow trench isolation structures and may be composed of silicon dioxide, tetra-ethyl-ortho-silicate, or other suitable isolation materials and may be formed using well-known damascene etching and fill techniques.

Two exemplary transistor gate stacks 18 and 20 are depicted on the substrate 10. The stack 18 consists of a gate dielectric layer 22, a gate electrode 24 and an overlying bottom anti-reflective coating ("BARC") 26. The stack 20 similarly consists of a gate dielectric layer 28, a gate electrode 30 and an overlying BARC layer 32. To illustrate the present invention, it is assumed that the gate stack 18 is earmarked for a non-speed path critical gate structure and the gate stack 20 is earmarked for a speed path critical gate structure. The skilled artisan will appreciate that the architecture for any given integrated circuit will include both speed path critical circuit devices and non-speed path critical circuit devices. In non-speed path critical devices, switching speed may not be as paramount as in speed path critical devices. Thus, design features that achieve a benefit, such as reduced static leakage current, at the expense of switching speed may be easier to implement in non-speed path critical devices than in speed path critical devices.

The gate dielectric layers 22 and 28 maybe fabricated using any of a myriad of well-known gate dielectric layer fabrication techniques and materials, for example, oxides, nitrides, nitrided oxides, high dielectric constant dielectrics or the like may be deposited using well-known thermal oxidation, chemical vapor deposition or like techniques. In an exemplary embodiment, the gate dielectric layers 22 and 28 may be formed by dry or wet oxidation in a furnace or rapid thermal anneal process to produce the films with a thickness of about 10 to 50 Å. If the furnace process is used, the temperature maybe for example about 650 to 1,000° C.

The gate electrodes 24 and 30 may be composed of a variety of materials suitable for gate fabrication such as, for example, polysilicon, amorphous silicon, aluminum, tantalum, copper, mixtures of these or the like. In an exemplary embodiment, the gate electrodes 24 and 30 are composed of polysilicon. Well-known techniques for applying polysilicon, such as CVD, may be used. In an exemplary embodiment, the polysilicon is deposited in-situ after the gate insulating layer 14 at or above about 625° C. to a thickness of about 750 to 1,800 Å, and advantageously to about 1300 Å. Later implants for source/drain regions will render the gates 24 and 30 conductive. Optionally, in-situ doping may be used.

The BARC structures 26 and 32 maybe applied to the layer used to pattern the gate electrodes 24 and 30 using well-known CVD, PVD or the like. The BARC structures 26 and 32 may be fabricated from well-known antireflective coating materials suitable for providing antireflective coating properties for the underlying gate electrodes 24 and 30 such as, for example, silicon rich nitride, silicon oxynitride, silicon nitride, or the like. The gate stacks 18 and 20 shown in FIG. 1 are patterned following deposition of the constituent layers by appropriate masking and anisotropic etching.

For example, if the gate electrodes 24 and 30 are composed of polysilicon, a $CF_4$ reactive ion etch or other directional etch technique may be used to pattern both the gates 24 and 30 as well as the underlying gate dielectric layers 22 and 28. The etch definition of the gate stacks 18 and 20 may proceed to the upper surface of the substrate 10 as shown or may be performed to leave laterally projecting remnants of the dielectric layers 22 and 28 as desired.

Following fabrication of the stacks 18 and 20, the insulating layer 34 is formed on the substrate 10. Portions of the insulating layer 34 form adjacent to the gate stacks 18 and 20 as narrow insulating structures or spacers 36 and 38. A purpose of the insulating layer 34 is to act as a screen oxide to protect the sidewalls of the gate electrodes 24 and 30 during later removal of the anti-reflective coatings 26 and 32. The layer 34 may be formed by oxidation, CVD or other well-known deposition techniques. In an exemplary embodiment, the insulating layer 34 may be formed by dry or wet oxidation in a furnace or rapid thermal anneal ("RTA") process to produce the layer 34 with a thickness of about 10 to 50 Å. If the furnace process is used, the temperature may be for example about 650 to 1,000° C. A suitable RTA temperature may be about 800 to 1,000° C.

Figure 2:
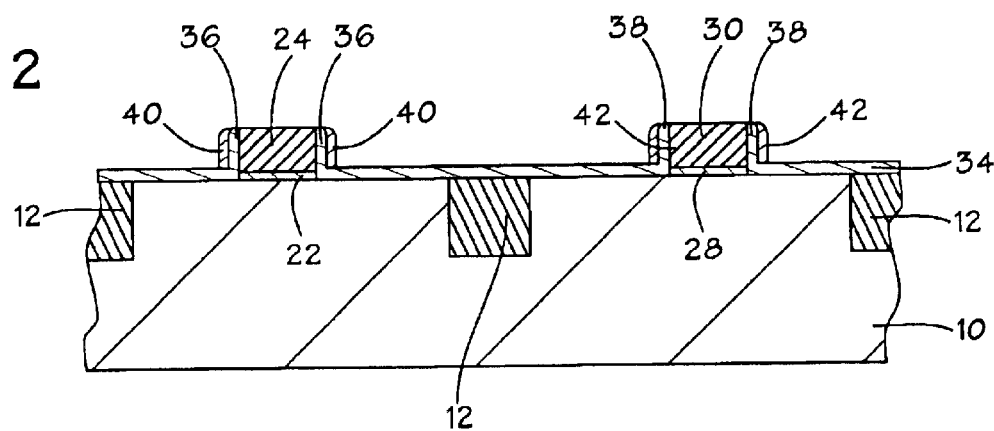
FIG. 2 is a cross-sectional view like FIG. 1 depicting formation of spacers adjacent the gate stacks in accordance with the present invention.

Referring now to FIG. 2, the BARC layers 26 and 32 are removed by, for example, hot phosphoric acid dip etching or plasma etching using for example $CF_4/O_2$ in a chemical plasma etch. Insulating structures or spacers 40 and 42 are next fabricated adjacent to the respective spacers 36 and 38 as shown. The purpose of the spacers 42 is to provide an oxygen diffusion barrier so that a subsequent oxidation step does not result in a thickening of the oxide spacers 38 or the gate dielectric layer 28 that might otherwise affect the electrical performance of the device utilizing the gate stack 20. The spacers 40 are formed simply because the deposition process used to lay down a blanket layer from which the spacers 40 and 42 are patterned is not masked. The spacers 40 and 42 are advantageously composed of a material that may be etched selectively to the oxide layer 34 and that provides a suitable diffusion barrier against oxygen. In an exemplary embodiment, the spacers 40 and 42 are composed of silicon nitride and may be patterned from a blanket-deposited layer of silicon nitride by low pressure or plasma enhanced CVD as desired. In an exemplary embodiment, the thickness of the layer used to pattern the spacers 40 and 42 may be about 50 to 250 Å. Patterning may be by directional etching using for example $CF_4/O_2$ in a plasma atmosphere.

Figure 3:
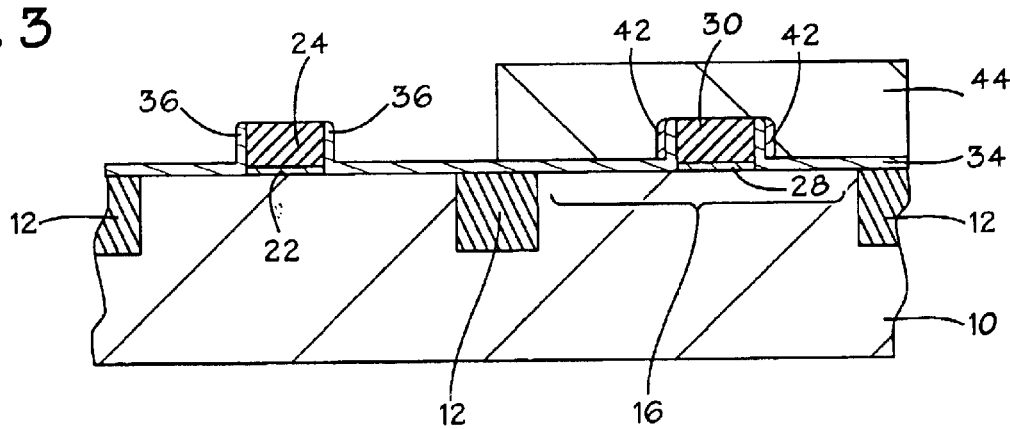
FIG. 3 is a cross-sectional view like FIG. 2 depicting selective masking of the substrate and removal of the spacers from one of the gate stacks in accordance with the present invention.

Referring now to FIG. 3, the substrate 10 is prepared for the removal of the spacers 40 and the subsequent thickening of the portions of the oxide layer 34 adjacent to the gate structure 18. Initially, a mask structure 44 is formed over the device region 16 and thereafter the spacers 40 are removed by a suitable etching process. The mask structure 44 may be composed of photoresist, or maybe a hard mask as desired. The purpose of the mask 44 is to protect the underlying spacers 42 from the etch process used to remove the spacers 40. Following fabrication of the mask 44, the spacers 40 are removed by, for example, hot phosphoric acid dip etching. Optionally, an isotropic plasma etch process with for example, a $CF_4/O_2$ may be used. Following the etch removal of the spacers 40, the mask structure 44 is stripped by ashing, solvent stripping or a combination thereof.

Figure 4:
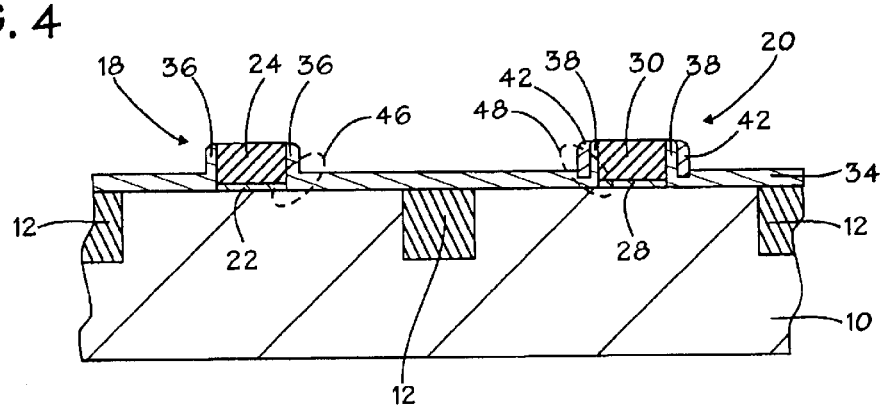
FIG. 4 is a cross-sectional view like FIG. 3 depicting selective thickening of the insulating layer in accordance with the present invention.

Referring now to FIG. 4, the portions of the insulating layer 34 adjacent to the gate stack 18, including the spacers 36, are thickened. This thickening is by oxidation. In an exemplary embodiment, another oxidation process is performed to thicken the spacers 36 and the portion of the insulating layer 34 adjacent to the spacers 36. The second oxidation may be by dry or wet oxidation in a furnace or RTA process. If the furnace process is used, the temperature may be for example about 650 to 1,000° C. A suitable RTA temperature may be about 800 to 1,000° C. The thickness of the insulating layer and the spacers 36 may be increased by about 10 to 50 Å layer.

Figure 5:
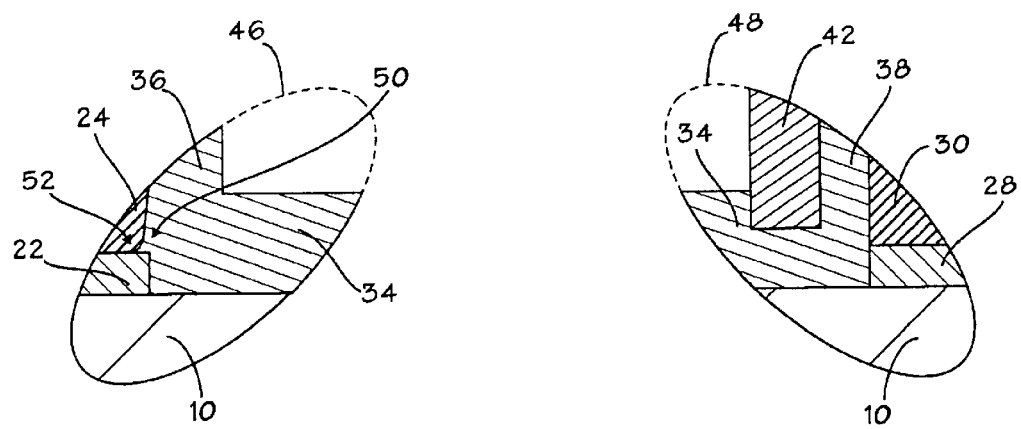
FIG. 5 is a magnified view of selected portions of FIG. 4 in accordance with the present invention.

The areas of FIG. 4 circumscribed by the dashed ovals 46 and 48 are shown at higher magnification in FIG. 5. While the oxidation thickens the spacer 36 and the layer 34 and produces a bird's beak 50, the presence of the diffusion-retarding spacers 42 prevents any appreciable thickening of the spacers 38 or the gate dielectric layer 28. Thus, leakage current between the gate 24 and the substrate 10, particularly at the gate corner 52 where the electric field density is highest, is reduced for the gate stack 18 without affecting the speed performance of the gate stack 20. A mirror-image thickening of the insulating layer 34 and bird's beak structure is produced at the opposite side of the gate 24. The creation of the bird's beak 50 can affect the speed performance of the gate stack 18. However, the gate stack 18 is not in the critical speed path, and the desired reduction in static leakage current, power usage and heat generation can be realized. It should be appreciated that the technique of the present invention may be used in virtually any circumstance where no or some speed performance may be traded for reduced power.

Figure 6:
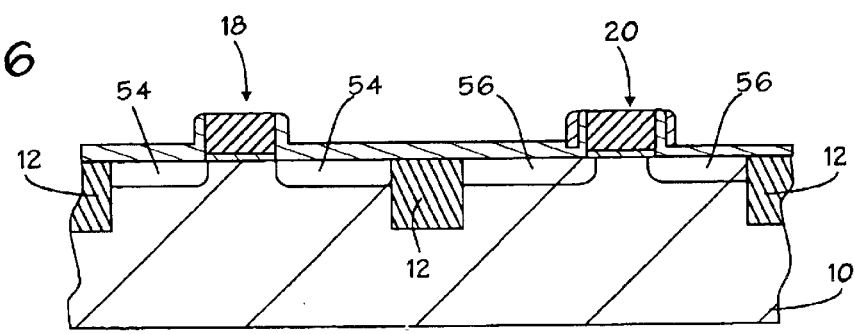
FIG. 6 is a cross-sectional view like FIG. 4 depicting additional processing of the substrate in accordance with the present invention.

Referring now to FIG. 6, the substrate 10 may undergo further processing. For example, source/drain regions 54 and 56 may be formed in the substrate by the ion implantation or diffusion. The phrase "source/drain region(s)" is used herein to describe a region that may serve as either a source or a drain. The skilled artisan will appreciate that a source/drain region may function as a source or a drain depending upon how it is subsequently coupled to interconnects. With the thickened insulating layer 34 and spacer 36 in place, gate current and its contribution to static current between the gate 24 and the source/drain regions 54 is reduced. The source/drain regions 54 and 56 may be single-graded as shown or include extension regions as desired.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming first and second gate stacks on a substrate;
   forming an insulating layer on the substrate, the insulating layer having portions adjacent to the first gate stack and portions adjacent to the second gate stack;
   forming a first pair of insulating structures adjacent to the first gate stack and a second pair of insulating structures adjacent to the second gate stack;
   removing the first pair of insulating structures; and
   thickening the portions of the insulating layer adjacent to the first gate stack, the second pair of insulating structures preventing thickening of the portions of the insulating layer adjacent to the second gate stack.

2. The method of claim 1, wherein the insulating layer comprises oxide.

3. The method of claim 2, wherein the oxide is formed by oxidation.

4. The method of claim 1, wherein the first and second pairs of insulating structures comprise silicon nitride.

5. The method of claim 1, wherein the first pair of insulating structures is removed by etching selectively to the insulating layer.

6. The method of claim 1, wherein thickening of the insulating layer comprises forming oxide.

7. The method of claim 6, wherein the forming of oxide comprises oxidation.

8. The method of claim 1, comprising forming an impurity region in the substrate after thickening the insulating layer.

9. A method of manufacturing, comprising:
   forming a speed path critical gate stack and a non-speed path critical gate stack on a substrate;
   forming an insulating layer on the substrate, the insulating layer having portions adjacent to the speed path critical gate stack and portions adjacent to the non-speed path critical gate stack,
   forming a first pair of insulating structures adjacent to the speed path critical gate stack and a second pair of insulating structures adjacent to the non-speed path critical gate stack;
   removing the second pair of insulating structures; and
   thickening the portions of the insulating layer adjacent to the non-speed path critical gate stack, the second pair of insulating structures preventing thickening of the portions of the insulating layer adjacent to the speed path critical gate stack.

10. The method of claim 9, wherein the insulating layer comprises oxide.

11. The method of claim 10, wherein the oxide is formed by oxidation.

12. The method of claim 9, wherein the first and second pairs of insulating structures comprise silicon nitride.

13. The method of claim 9, wherein the first pair of insulating structures is removed by etching selectively to the insulating layer.

14. The method of claim 9, wherein the thickening of the insulating layer comprises forming oxide.

15. The method of claim 14, wherein the forming of oxide comprises oxidation.

16. The method of claim 9, comprising forming an impurity region in the substrate after thickening the insulating layer.

17. A method of manufacturing, comprising:
   forming a speed path critical gate stack and a non-speed path critical gate stack on a substrate;
   forming an oxide layer on the substrate by oxidation, the oxide layer having portions adjacent to the speed path critical gate stack and portions adjacent to the non-speed path critical gate stack;
   forming a first pair of silicon nitride structures adjacent to the speed path critical gate stack and a second pair of silicon nitride structures adjacent to the non-speed path critical gate stack;
   removing the second pair of silicon nitride structures; and
   thickening the portions of the oxide layer adjacent to the non-speed path critical gate stack, the second pair of silicon nitride structures preventing thickening of the portions of the oxide layer adjacent to the speed path critical gate stack.

18. The method of claim 17, wherein the first pair of insulating structures is removed by etching selectively to the insulating layer.

19. The method of claim 17, wherein the thickening of the insulating layer comprises forming more oxide.

20. The method of claim 19, wherein the forming of more oxide comprises oxidation.

21. The method of claim 19, comprising forming an impurity region in the substrate after thickening the oxide layer.

* * * * *